United States Patent [19]

Thomas et al.

[11] Patent Number: 4,635,230
[45] Date of Patent: Jan. 6, 1987

[54] EMITTER COUPLED LOGIC BIPOLAR MEMORY CELL

[75] Inventors: Mammen Thomas; Wen C. Ko, both of San Jose, Calif.

[73] Assignee: Advanced Micro Devices, Inc., Sunnyvale, Calif.

[21] Appl. No.: 683,287

[22] Filed: Dec. 18, 1984

[51] Int. Cl.[4] .............................................. G11C 11/40
[52] U.S. Cl. .................... 365/175; 365/154; 357/92; 307/317 A
[58] Field of Search ............... 365/154, 155, 156, 175, 365/177, 190; 357/15, 71 S, 92; 307/317 A

[56] References Cited

U.S. PATENT DOCUMENTS

| | | | |
|---|---|---|---|
| 3,909,807 | 9/1975 | Fulton | 307/317 A |
| 4,460,984 | 7/1984 | Knepper | 365/154 |
| 4,480,319 | 10/1984 | Hotta et al. | 365/155 |
| 4,513,309 | 4/1985 | Cricchi | 357/15 |
| 4,543,595 | 9/1985 | Vora | 365/154 |

OTHER PUBLICATIONS

Dorler et al., "A 1024-Byte ECL Randon Access Memory Using a Complementary Transistor Switch Cell," IBM J. Res. Dev., vol. 25, No. 3, May 1981, pp. 126-134.

Agraz-Guerena et al., "OXIL, A Versatile Bipolar VLSI Technology," IEEE Journal of Solid-State Circuits, vol. SC-15, No. 4, Aug. 1980, pp. 462-466.

*Primary Examiner*—Terrell W. Fears
*Attorney, Agent, or Firm*—Patrick T. King; Eugene H. Valet; John P. Taylor

[57] ABSTRACT

An improved ECL bipolar memory cell is disclosed which comprises connecting the respective collectors of the memory transistors in the flip-flop circuit to bit lines using Schottky diodes to protect against latch-up of the ECL cell; and the inversion of the transistors in the circuits to provide a buried emitter construction for alpha strike protection. In a preferred embodiment, the Schottky diode and the load devices, such as resistors or load transistors used to couple the cell to one of the word lines are made using polysilicon to facilitate construction of the cell, reduce the total number of contacts needed, and enhance the speed of the cell.

4 Claims, 17 Drawing Figures

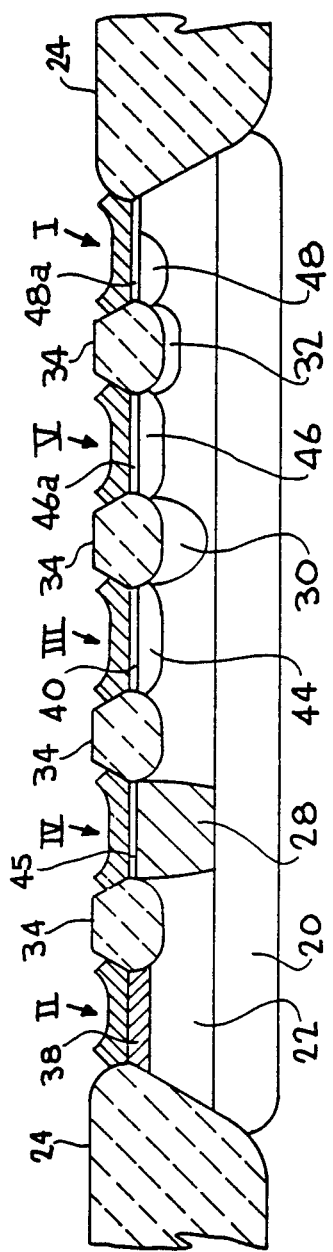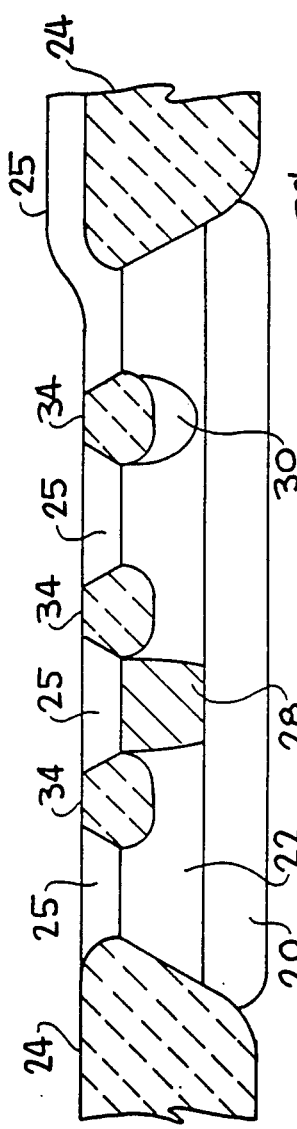
FIG. 4
FIG. 5A
FIG. 5B

EMITTER COUPLED LOGIC BIPOLAR MEMORY CELL

BACKGROUND OF THE INVENTION

1. Field of the Invention

This invention relates to integrated circuit devices and more particularly to an improved Emitter Coupled Logic (ECL) bipolar memory cell.

2. Background Art

The basic structure of an Emitter Coupled Logic (ECL) bipolar memory cell comprises a pair of memory transistors cross coupled to form a flip-flop circuit. The collectors of the memory transistors are respectively connected to the Vcc word line either through a resistive load or through a PNP load. To connect the cell to bit lines, either a diode design or an additional emitter design is used as respectively shown in FIGS. 1a and 1b representing prior art ECL structures.

Integrated Injection Logic (I²L) or merged transistor logic has been also used in memory applications wherein the Vcc word line I is coupled to the memory cell through a PNP load having its collector connected to the base of the memory transistor and the base of the PNP load is connected to word line II. Typical of such a construction is the bipolar memory cell shown in Fulton U.S. Pat. No. 3,909,807. However, this type of logic has the disadvantage that the cell swings are very small, i.e, about 0.2 volts which creates problems with sensing the state of the cell. This also makes the design more sensitive to noise which can, therefore, make the cell difficult to read. Such designs have also tended to be slow due to the saturated nature of the circuit operation. Some of the problems of I²L technology are discussed by Agraz-Guerena et al in "OXIL, A Versatile Bipolar VLSI Technology" in IEEE Journal of Solid-State Circuits, Vol SC-15, No. 4, August, 1980 at pp. 462–466.

On the other hand, ECL designs, as described above, have been quite suitable in the past for cells which are large, i.e., cells used in L.S.I and, in some instances, VLSI structures. The space taken by the device was not critical, thus permitting a number of contact areas and isolation tubs. For example, Dorler et al in "A 1024-Byte ECL Random Access Memory using Complimentary Transistor Switch (CTS) Cell", IBM Journal of Research and Development, Vol. 25, No. 3 (May 1981), pp. 126–134, show, at page 128, shows a modified ECL structure having multiple tubs.

However, as devices using ECL circuitry shrank in size, the number of contacts and the size of isolation areas became the constraint resulting in the need to reduce the number of such contacts and to reduce the size of the isolation areas, and to locate all of the components of a particular cell in the same tub. This, in turn, has resulted in the reduction of storage capacitance which creates a problem of added sensitivity to parasitic charges generated by alpha particles striking the integrated circuit structure (alpha strike) which can results in soft errors. Reduced size also can result in PNPN latch-up due to common tub-bit line contact.

SUMMARY OF THE INVENTION

It is therefore an object of the invention to provide an improved ECL bipolar memory cell having improved resistance to latch-up.

It is another object of the invention to provide an improved ECL bipolar memory cell using Schottky diode connections to bit lines to provide improved resistance to latch-up and an inverted cell structure to improve resistance to alpha strike.

It is yet another object of the invention to provide an improved ECL bipolar memory cell using Schottky diode connections to bit lines to improve resistance to latch-up wherein the cathode of the Schottky diode comprises polysilicon to improve performance of the diode and facilitate construction of the diode and load device portions of the cell.

It is a further object of the invention to provide an improved ECL bipolar memory cell using Schottky diode connections to bit lines to provide improved resistance to latch-up and an inverted cell structure to improve resistance to alpha strike by providing a common buried emitter for the transistors forming the flip flop circuit of the cell to provide protection against soft errors produced by alpha particles striking the cell.

These and other objects of the invention will be apparent from the description and drawings.

In accordance with the invention a bipolar memory cell having improved resistance to latch-up and soft errors caused by alpha strike comprises: a pair of cross-coupled memory transistors having their respective bases coupled to the collector of the other transistor to form a flip flop circuit; load devices respectively connected between a first word line and the collector of each memory transistor; a common buried emitter for the memory transistors with the common emitter connected to a second word line; and a pair of Schottky diodes respectively connecting left and right bit lines to the collectors of said memory transistors; whereby the low minority carrier injection efficiency of the Schottky diodes prevents latch-up of the cell and the common buried emitter for the memory transistors provides protection against alpha strike.

In a preferred embodiment, the load devices and the Schottky diodes are constructed using polysilicon to facilitate construction and operation of the cell.

BRIEF DESCRIPTION OF THE DRAWINGS

FIG. 4 is a cross-section view of an integrated circuit construction corresponding to the half cell shown schematically in FIG. 3.

FIG. 5A is a cross-section view of an intermediate stage of construction of another embodiment of an integrated circuit construction corresponding to the half cell shown schematically in FIG. 3.

FIG. 5B is a cross-section view of the embodiment of FIG. 5A after construction of the remainder of the cell.

DESCRIPTION OF THE PREFERRED EMBODIMENT

Figure 1A:
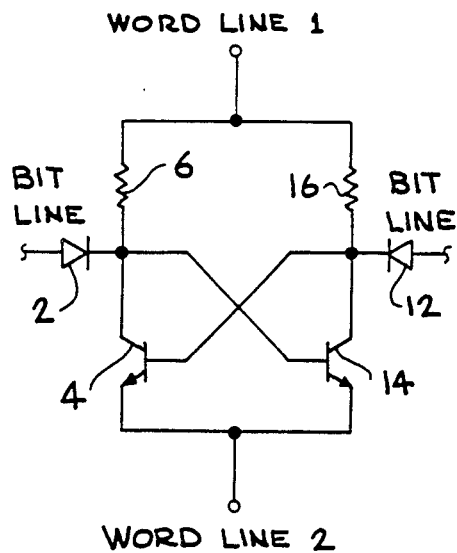
FIG. 1A is a schematic diagram of one embodiment of a prior art memory cell.
Figure 1B:
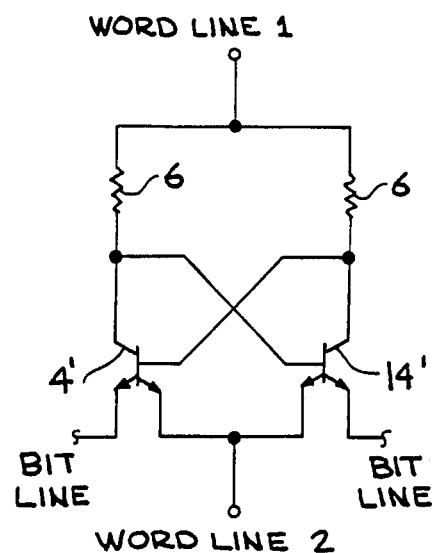
FIG. 1B is a schematic diagram of another embodiment of a prior memory cell.

As shown in FIGS. 1a and 1b, prior art designs of ECL bipolar memory cells used either diodes or an additional emitter design to connect the cells to bit lines. Thus, for example, as shown in FIG. 1a, the left bit line is connected through diode 2 to the collector of memory transistor 4 and the base of memory transistor 14. Resistor 6, connected at one end to the same point, couples the cell to a first or top word line. Similarly, the collector of transistor 14 and the base of transistor 4 are connected through diode 12 to the right bit line and by resistor 16 to the first word line. The emitters of both transistors 4 and 14 are connected together to a second or bottom word line. The prior art ECL cell of FIG. 1b omits diodes 2 and 12 and uses, instead, additional emitters from transistors 4' and 14' to connect the cell respectively to the left and right bit lines.

The coupling of such cells to bit lines using conventional diodes or additional emitters is satisfactory provided sufficient space is available to provide diode contacts isolated from the transistor contacts, using oxide between the contacts. However, the reduction in size of ECL integrated circuit structures and the need, therefore, to reduce the number of contacts and isolations, has resulted in location of both the diodes and the transistors in the same tub or isolation area. This, in turn, can cause latch-up by a PNPN effect between the P-emitter of the diode and the three regions of the transistor.

Figure 2:
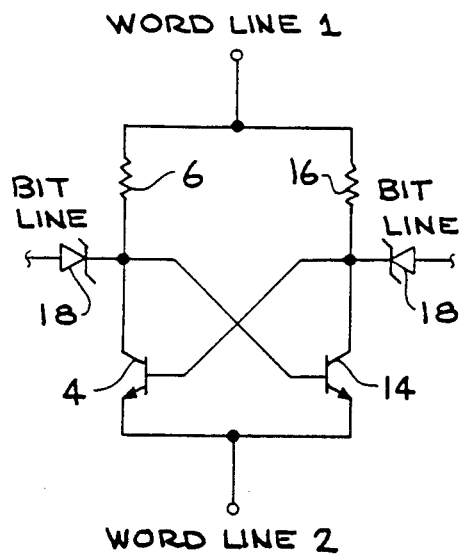
FIG. 2 is a schematic diagram of one embodiment of the memory cell of the invention.

In accordance with one embodiment of the invention, as shown schematically in FIG. 2, this problem of latch-up may be corrected by the use of Schottky diodes 18 to connect the bit lines to the cell. Since the anode of the Schottky diode is metal, rather than a semiconductor, the Schottky diode has very low minority carrier injection efficiency and, thus, the PNPN latch-up problem of the prior art can be avoided because there is no hole emission (minority carrier injection) from the anode into the silicon cathode.

Figure 3:
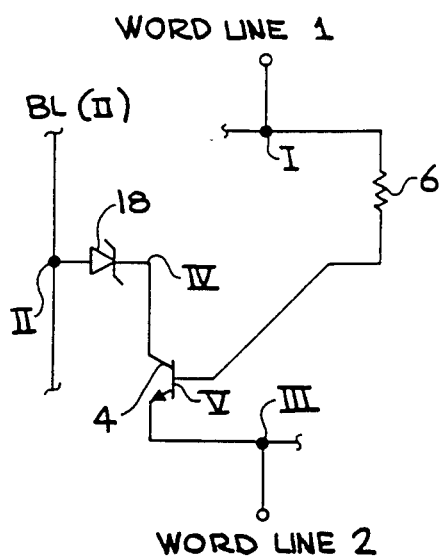
FIG. 3 is a schematic diagram of half of the memory cell of FIG. 2.

Construction of an ECL bipolar memory cell connected to bit lines by Schottky diodes 18 is illustrated in FIGS. 3 and 4. In FIG. 3, half of the cell is shown in schematic form and in FIG. 4 construction details of the half cell are shown.

In FIG. 4, layer 20, which may be formed directly on a silicon substrate, represents an N+ buried collector layer for the collector of transistor 4. Buried collector 20 may be formed by doping a layer of silicon by ion implantation or diffusion with an N type dopant such as arsenic or antimony at a very high concentration of $10^{18}$ to $10^{21}$ cm$^{-3}$.

A layer of silicon 22 is then epitaxially grown over buried layer 20, masked, and an oxide layer 24, is grown over epitaxial layer 22, to form the tub in which the cell will be fabricated. This tub is then masked and oxide 34 is grown to provide contact openings I–V as well as the doping regions in epitaxial layer 22 for formation of Schottky diode 18, transistor 4, and resistor 6 of FIG. 3. A contact well or sinker 28 is formed by doping the epitaxial silicon 22 at that point with a high concentration of N dopant such as phosphorus. Contact well 28 or sinker interconnects contact IV with buried collector 20. A contact implant 45 is formed over sinker 28 at the same time as formation of emitter 40, as will be described.

A low resistance base region 30 is provided in epitaxial layer 22 by doping with boron at a concentration of $10^{17}$ to $10^{19}$ cm$^{-3}$ by diffusion or ion implantation. Adjoining active base regions 44 and 46 are also formed by doping layer 22 with boron.

Resistor 6 is formed at 32 in epitaxial silicon layer 22 by doping the silicon by diffusion or ion implantation with boron at a concentration of $10^{14}$ to $10^{18}$ cm$^{-3}$. A contact portion 48 of resistor 32, located beneath contact I, is formed by further doping silicon layer 22 with boron at a higher concentration of $10^{17}$ to $10^{19}$ cm$^{-3}$ by ion implantation or diffusion. A high dose contact implant 48a is shown between metal contact I and contact region 48 to make the contact a resistive contact. A similar contact implant 46a is used over base region 46.

Schottky diode 18 may be formed at 38 by depositing a metal capable of reacting with silicon layer 22 to form a metal silicide; and then sintering to form the metal silicide anode of the Schottky diode on the N type epitaxial silicon layer which forms the cathode of the diode. The sintering is carried out at a temperature of about 400° to 900° C.

Metals capable of reacting with silicon to form a metal silicide include cobalt, chromium, hafnium, iridium, manganese, molybdenum, nickel, palladium, platinum, rhenium, tantalum, titanium, tungsten, and zirconium. Platinum is the preferred metal.

The emitter of transistor 4 may be formed at 40 by doping layer 22 with arsenic at a concentration of $10^{19}$ to $10^{21}$ cm$^{-3}$ by ion implantation. The intrinsic base of transistor 4 may be formed at 44 by doping layer 22 with boron at a concentration of $10^{16}$ to $10^{18}$ cm$^{-3}$ by ion implantation. Base 44 is connected to base 30 which is already formed in layer 22. A further portion of the base 46, also formed in layer 22 at the same time as base 44, is located beneath the base contact V.

Contacts I–V are formed from a layer of aluminum which is deposited after formation of diode 18, 20 resistor 6, and transistor 4. The aluminum layer is appropriately masked to provide the metal contact points. These Roman numerals correspond to the numerals shown in FIG. 3 representing the contact points respectively at both ends of resistor 6, Schottky diode 18, and the three electrodes of transistor 4.

Turning now to FIGS. 5a and 5b, a preferred embodiment is shown wherein a layer of polysilicon has been used to form both the Schottky diode and the polyresistor of the ECL device. In this embodiment, a layer 25 of polysilicon is deposited over the previously masked silicon layer 22 as shown in FIG. 5a. The polysilicon may then be masked to grow oxide portions 34. Alternatively, oxide portions 34 may be formed, if desired, prior to the deposition of polysilicon layer 25—in which case, the polysilicon deposited over oxide 34 would have to be selectively removed.

A Schottky diode is formed at 38' in FIG. 5b by forming a silicide, as previously described, on that portion of the polysilicon which may be undoped or lightly doped at a concentration of $10^{15}$ to $10^{16}$ cm$^{-3}$ type implant. Polysilicon portion 28a over sinker 28 is N doped with phosphorus or arsenic at a concentration of $10^{18}$ to $10^{21}$ cm$^{-3}$ implantation to insure good conductivity. Polysilicon resistor region 32' is formed by doping that portion of the polysilicon beneath oxide 52 with boron by implantation at a concentration sufficient to give the needed sheet resistance. Emitter 40' is formed below polysilicon portion 44a by doping the polysilicon with arsenic or phosphorus. One end of resistor region 32' is over base contact region 46' in the underlying epi layer 22. The top of the polysilicon resistor region 32' under contact V forms the common contact for resistor 6 and the base of transistor 4.

As stated above, the use of polysilicon in the construction of the structure of the invention is preferred for a number of reasons. First, use of a polysilicon layer over the emitter of a transistor gives one the advantage of a very high emitter efficiency and also allows vertical shrinkage of the transistor thereby increasing its speed of operation. Secondly, this type of construction permits locating the polysilicon resistor above the oxide isolation area which reduces the area requirement for the cell. Additionally, use of polysilicon for the Schottky diode gives a higher voltage drop and can permit field plating to reduce edge leakage, if desired. Thus, the use of polysilicon permits both horizontal and vertical shrinkage of the device. In view of this, all of the following embodiments of the invention will be illustrated with the use of polysilicon.

Figure 6:
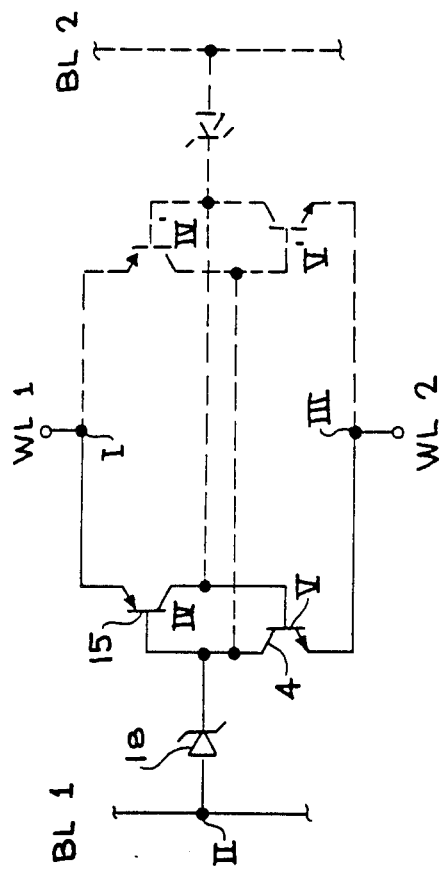
FIG. 6 is a schematic diagram showing the half cell for another embodiment of a memory cell using a PNP load with the Schottky read-write diodes shown in FIGS. 2-5.
Figure 7:
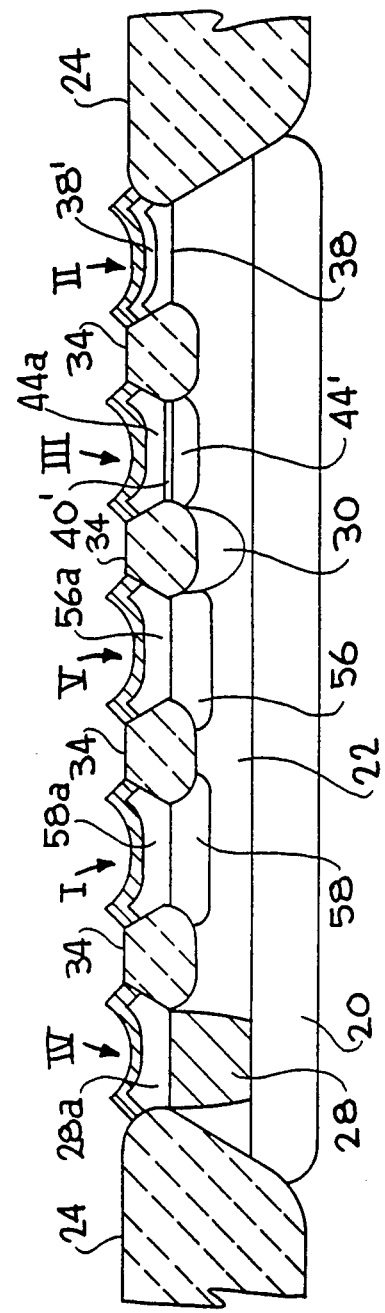
FIG. 7 is a cross-section of an integrated circuit construction corresponding to the half cell shown schematically in FIG. 6.

In FIGS. 6 and 7, yet another embodiment of the ECL bipolar memory cell incorporating Schottky diode 18 is shown wherein resistor 6 is replaced by a load transistor 15 which is shown as a PNP load, although an NPN load could be used in appropriate circumstances. In FIG. 6, the other half of the memory cell is shown schematically in dotted lines for purposes of clarity. However, only the half cell portion shown in solid lines in FIG. 6 is shown constructed in the integrated circuit structure shown in FIG. 7. In this embodiment, wherein like numerals indicate like portions to those shown in the figures previously described, a Schottky diode is again formed at 38'.

Collector portion 56 and emitter portion 58, respectively under polysilicon portions 56a and 58a, in FIG. 7, represent the lateral PNP implant forming PNP transistor 15 acting as the load device. Collector portion 56 and emitter portion 58 of transistor 15 are formed by doping epitaxial layer 22 with boron at a concentration of $10^{17}$ to $10^{19}$ cm$^{-3}$ by ion implantation. Polysilicon portions 56a and 58a are also doped with boron to provide good conductivity. Portion 56a, also forms the base contact of memory transistor 4 together with portions 56 and 30. Epitaxial layer 22 forms the base of transistor 15.

The shrinking size of ECL bipolar memory cells also tends to reduce the storage capacitance of the cell which creates a problem of alpha sensitivity wherein an alpha particle may strike the collector-base junction of the off transistor causing a negative charge to appear in that collector-base junction which will cause the flip-flop circuit to change.

Figure 8:
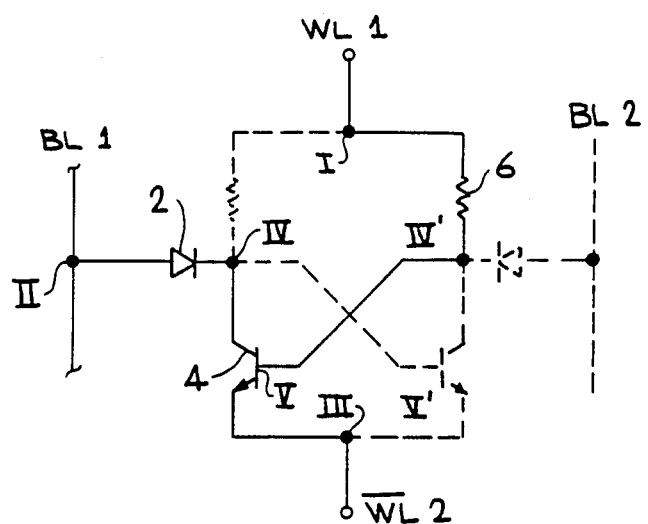
FIG. 8 is a schematic of a half cell of yet another embodiment of a memory cell wherein the cell is inverted to provide a buried emitter.
Figure 9:
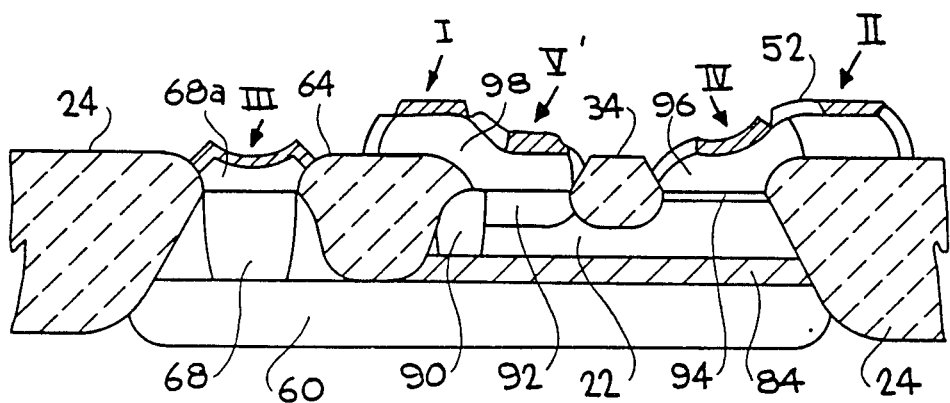
FIG. 9 is a cross-section view of an integrated circuit construction corresponding to the half cell shown schematically in FIG. 8.

Turning now to FIGS. 8 and 9, another embodiment of the ECL bipolar memory cell is shown wherein the problem of alpha strike is prevented or mitigated by constructing an inverted ECL cell. Enhanced alpha strike protection is provided in the embodiment of FIGS. 8 and 9, as well as in subsequent embodiments, by burying the emitters of transistors 4 and 14, rather than the collectors, and making them a common collection node for alpha generated carriers thus reducing the occurrences of soft errors.

This construction has an added advantage in that the common buried emitter, used for both transistors 4 and 14 in the flip flop circuit in the cell, reduces the number of contacts needed, i.e., by eliminating the need to connect independent emitters in a single word line together via contacts.

Buried emitter 60 comprises a layer of silicon which has been N-doped with antimony or arsenic at a concentration of $10^{18}$ to $10^{21}$ cm$^{-3}$ by ion implantation or diffusion.

An intrinsic base portion 84 is formed over buried emitter 60 by an up-diffusion process which comprises first masking and selectively implanting or diffusing boron or any other P dopant into the open regions of buried layer 60 through the mask. After this doping, an epitaxial layer 22 is grown. At this time, the P dopant in the previously doped buried layer 60 diffuses out into epitaxial layer 22 to form intrinsic base region 84.

A contact well or sink 68 interconnects buried emitter 60 with contact III through polysilicon contact portion 68a. Contact well 68 is formed by doping a silicon layer doped with phosphorus by ion implantation at a concentration sufficient to provide good conductivity. A P+ contact region 90 is formed in layer 22 by boron diffusion to provide contact between intrinsic base 84 and one contact of resistor 98. A P+ implant 92 is formed in layer 22 by boron implantation for the purpose of forming a base contact. Collector pick-up area 94 is formed by N doping layer 22.

After forming the foregoing regions, a layer of polysilicon may be deposited over the structure to form diode 2 and resistor 6. Resistor 6 is formed at 98 by appropriately doping polysilicon as described in the embodiment illustrated in FIG. 5. Diode 2 is formed at 96 by a similar process as the resistor except that an N+ implantation is made into the polysilicon layer over the collector region with a dose of $10^{14}$ to $10^{16}$ cm$^{-2}$ phosphorus or arsenic. This same implant may be used to form the collector pick-up area 94 if needed. The resultant structure of FIG. 9, by providing a common, buried, emitter, provides protection against alpha strike or other soft errors. Additionally, since word line 2 is common for the whole row of cells comprising the word length, emitter contact 68 and 68a, shown separated from the cell by oxide 64, need not be repeated for each cell, thus saving space.

Figure 10:
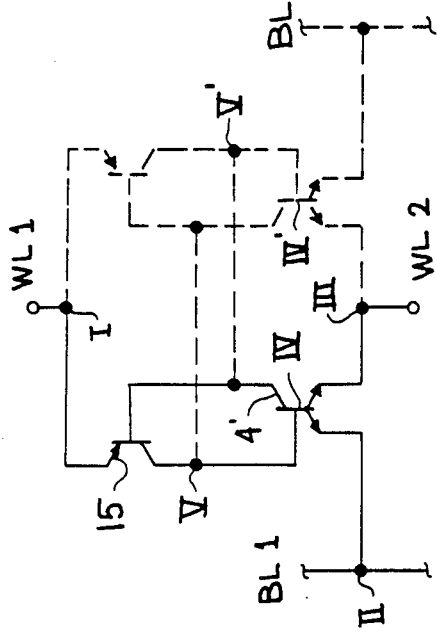
FIG. 10 is a half cell schematic of another embodiment of the schematic shown in FIG. 8 wherein the resistor load is replaced with a PNP load.
Figure 11:
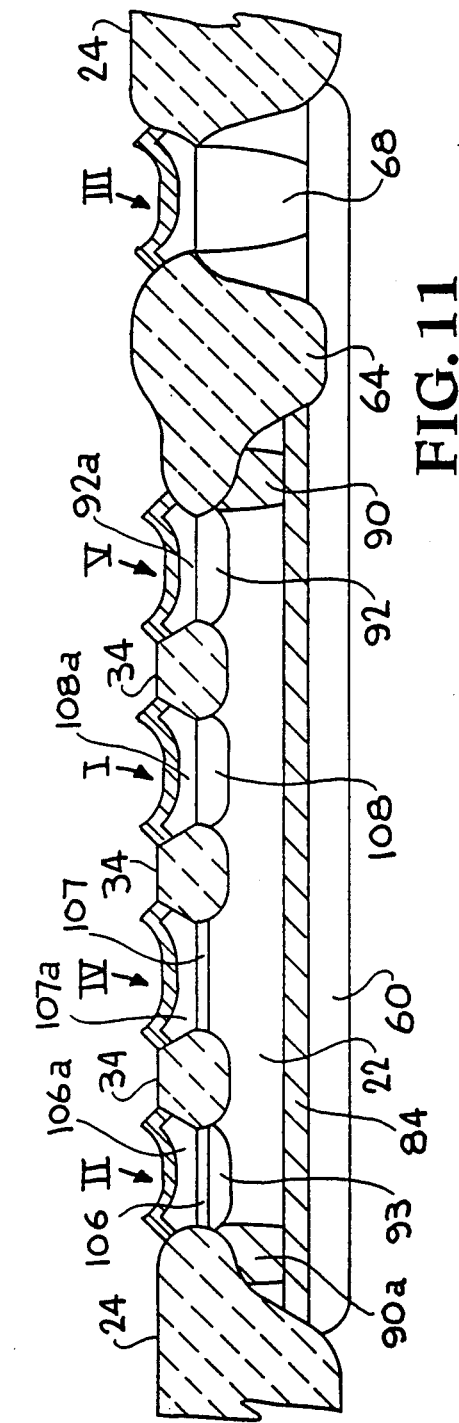
FIG. 11 is a cross-section view of an integrated circuit construction corresponding to the half cell shown schematically in FIG. 10.
Figure 12:
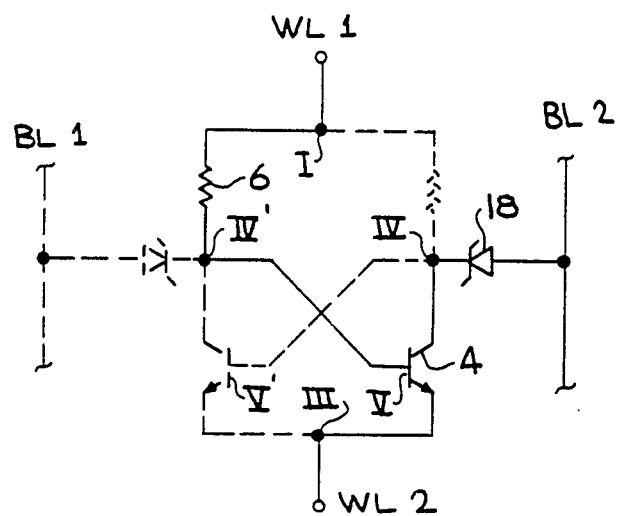
FIG. 12 is a half cell schematic of yet another embodiment of a memory cell incorporating therein the features shown in both FIG. 3 and FIG. 8.
Figure 13:
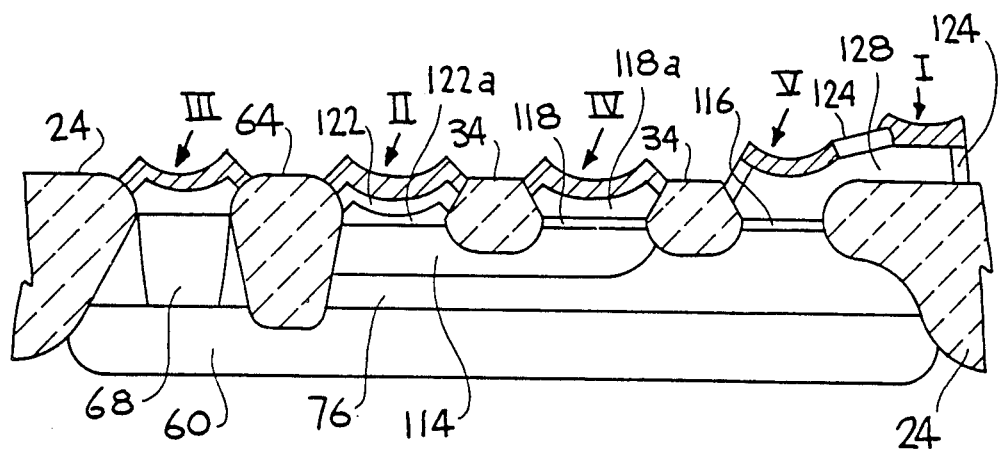
FIG. 13 is a cross-section view of an integrated circuit construction corresponding to the half cell shown schematically in FIG. 12.

Turning now to FIGS. 10 and 11, the embodiment of FIGS. 8 and 9 is shown with PNP load or transistor 15 replacing resistor 6; and diode 2 replaced by a multi-emitter transistor 4'.

In this embodiment, a P+ implant is formed at 108 under polysilicon contact 108a which is also P doped for the emitter of PNP load transistor 15. Contact wells 90 and 90a are formed, respectively, to provide contact from the base 84 to base contact V through implant 92 and polysilicon region 92a and to base 93 of bit line transistor 4'. Emitter 106 and collector pick-up 107 formed by arsenic or phosphorus implant respectively through polysilicon regions 106a and 107a.

While the use of Schottky diodes to couple the cell to bit lines and the use of a common, buried, emitter each contribute to enhanced performance of an ECL bipolar memory cell, particularly when the devices are made dimensionally smaller, the combination of the two aspects of the invention results in further improvement of performance not possible with either aspect alone. The use of Schottky diodes in combination with the common, buried, emitter concept insures that any latch-up problems, which might otherwise occur due to use of a buried emitter, are avoided.

The improved ECL bipolar memory cell, as illustrated in FIGS. 12–15, provides smaller cells, more immunity from alpha sensitivity, better protection against latch-up, and, in a preferred embodiment, simplification of construction by permitting the use of a patterned polysilicon layer to be used for the Schottky diode base, the collector contact for the memory transistor, and the load device, i.e., the resistor or the base of the PNP load transistor.

FIGS. 12–15, illustrate another aspect of the invention in two embodiments. As stated above, in these embodiments, the ECL bipolar memory cell is inverted, i.e., the emitter is buried, and Schottky diodes are used to interconnect the cell to the bit lines. In the construction of the embodiment shown in FIGS. 12 and 13, a buried emitter is again shown as layer 60. A Schottky diode contact is formed at 122 over polysilicon 122a using a suitable metal, as previously discussed, and sintering the metal to the polysilicon layer 122a to form the metal silicide anode of the diode.

An implanted collector, shown at 114, is formed by a phosphorus implant into P epitaxial layer 76. A base contact region, shown at 116, is formed by a P implantation using boron. A collector contact implant, shown at 118, is formed through polysilicon 118a by an N implantation using arsenic or phosphorus as is well known to those skilled in the art. A similar process as described in FIG. 9 can be used to form an up-diffused base with the Schottky diode construction of FIG. 13.

Figure 14:
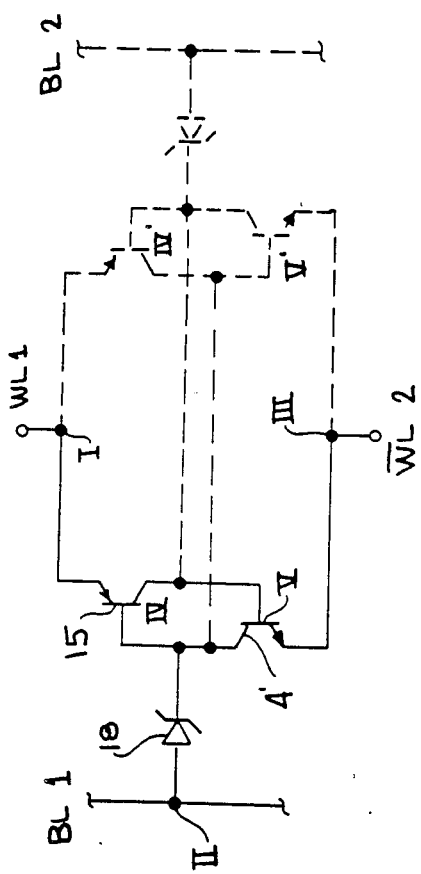
FIG. 14 is a half cell schematic of another embodiment of a memory cell incorporating therein both the features shown in the schematics of FIG. 6 and FIG. 8.
Figure 15:
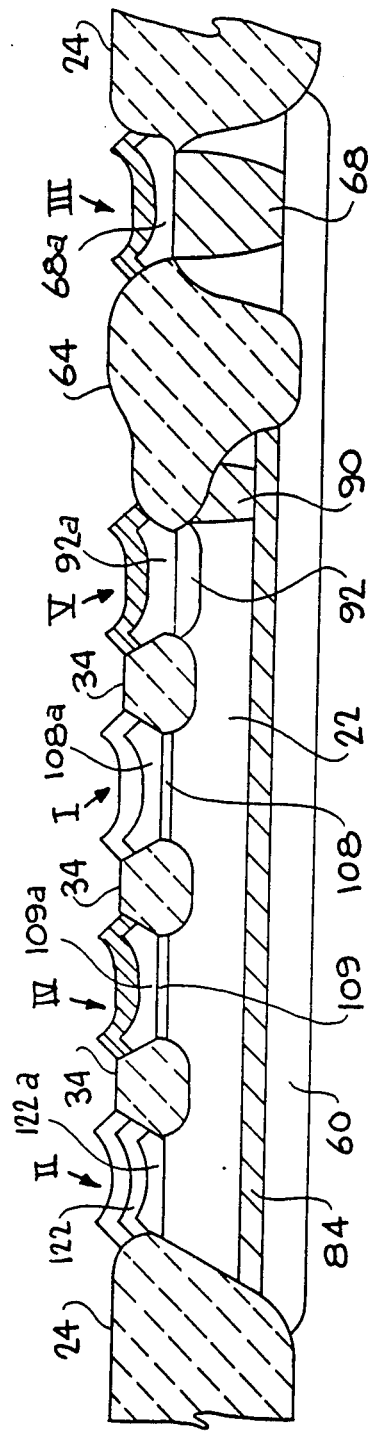
FIG. 15 is a cross-section view of an integrated circuit construction corresponding to the half cell shown schematically in FIG. 14.

A similar embodiment is shown in FIGS. 14 and 15 where, as in earlier embodiments, resistor 6 is replaced by PNP load or transistor 15. Again the emitter of memory transistor 4 is contained in buried layer 60. Contact well 68, through polysilicon 68a, connects the buried emitter to the metal contact III. Intrinsic base 84 is connected through 90, 92, and 92a to the metal base contact V. The P+ implant for the emitter is shown at 108 through polysilicon 108a, while an N- epitaxial collector layer is shown at 22 which, under 108, forms the base of the PNP load transistor 5 and the collector of NPN memory transistor 4'. A collector contact implant is shown at 109 and polysilicon 109a connecting collector 22 to metal contact IV representing the base of load transistor 15 and the collector of memory transistor 4'. The Schottky diode is again shown formed on polysilicon 122a at 122.

Thus, the novel ECL bipolar memory cell, as shown in its various aspects, addresses the problems encountered when shrinking the size of a bipolar memory cell, such as latch-up, alpha-sensitivity, and available contact space. The invention, by using Schottky diodes and a common, buried emitter, provides enhanced protection against latch-up and alpha strike which may be occasioned by the close spacing of devices within the same tub in an integrated circuit structure. In a preferred embodiment, a layer of polysilicon can be used to form both the Schottky diodes and the load devices to facilitate both the construction and operation of the cell. The use of polysilicon also improves the emitter efficiency of the transistor.

Having thus described the invention, what is claimed is:

1. An improved ECL bipolar memory cell having a first Schottky diode, formed from a portion of a polysilicon layer and a metal silicide connected between a bit line and the collector of a first transistor; a second Schottky diode also formed from a portion of the same polysilicon layer and a metal silicide connected between a second bit line and the collector of a second transistor; said first transistor having its base connected to said collector of said second transistor, said second transistor having its base connected to the collector of said first transistor whereby a flip-flop circuit is formed; and said first and second transistors having their collectors respectively coupled to a first word line through a polysilicon load device also formed from portions of said polysilicon layer and their emitters connected together in a buried layer which is connected to a second word line to reduce alpha strike-induced errors; said cell having enhanced resistance to latch-up because of the low minority carrier efficiency of said Schottky diodes.

2. The memory cell of claim 1 wherein said metal silicide is formed by reacting with said polysilicon a metal capable of reacting to form said metal silicide selected from the class consisting of cobalt, chromium, hafnium, iridium, manganese, molybdenum, nickel, palladium, platinum, rhenium, tantalum, titanium, tungsten, and zirconium.

3. The memory cell of claim 2 wherein said metal portion of said metal silicide comprises platinum.

4. The memory cell of claim 1 wherein said load devices comprises polysilicon resistors formed over isolation oxide on the edge of the cell, said polysilicon resistors comprising portions of the same polysilicon layer from which said Schottky diodes are formed.

* * * * *